United States Patent [19]

Kokubun

[11] Patent Number: 5,180,929
[45] Date of Patent: Jan. 19, 1993

[54] VOLTAGE MEASURING CIRCUIT
[75] Inventor: Hitoshi Kokubun, Tokyo, Japan
[73] Assignee: Oki Electric Industry Co., Ltd., Tokyo, Japan
[21] Appl. No.: 713,796
[22] Filed: Jun. 12, 1991
[30] Foreign Application Priority Data Jun. 13, 1990 [JP] Japan ................................ 2-154254

[51] Int. Cl.[5] ........................ G06G 7/10; H03K 5/153
[52] U.S. Cl. .................... 307/350; 307/355; 307/362; 307/491; 307/494; 307/530
[58] Field of Search ................ 307/350, 354-356, 307/362, 491, 494, 530

[56] References Cited

U.S. PATENT DOCUMENTS

| 4,587,442 | 5/1986 | Gray et al. | 307/350 |
| 4,752,699 | 6/1988 | Cranford, Jr. et al. | 307/494 |
| 4,952,821 | 8/1990 | Kokubun | 307/350 |
| 5,075,572 | 12/1991 | Poteet et al. | 307/354 |

FOREIGN PATENT DOCUMENTS 63-310207 12/1988 Japan .

Primary Examiner—William L. Sikes
Assistant Examiner—Margaret Rose Wambach
Attorney, Agent, or Firm—Edward D. Manzo; John J. King

[57] ABSTRACT

A voltage measuring circuit for detecting an unknown voltage in a semiconductor integrated circuit or the like. A voltage to be measured is converted into a first current by a current converting transistor, and a difference between the first current and a reference current is converted into a voltage. As a result, the voltage measuring circuit can be arranged without using a floating node, whereby it is possible to prevent variations in a desired voltage value to be measured.

19 Claims, 3 Drawing Sheets

RELATIONSHIP BETWEEN FIRST CURRENT $I_{10}$ AND REFERENCE CURRENT $I_{11}$

VOLTAGE MEASURING CIRCUIT

REFERENCE TO RELATED APPLICATIONS

This application claims the right of priority under 35 U.S.C. 119 of Japanese Patent Application No. 02-154254, filed on Jun. 13, 1990, the entire disclosure of which is incorporated herein by reference.

BACKGROUND OF THE INVENTION (1) Field of the Invention

The present invention relates to a voltage measuring circuit for detecting an unknown voltage in a semiconductor integrated circuit, which has less power source voltage dependency, temperature dependency, and in which a desired detected voltage value can be varied by changing data in an internal memory element.

(2) Description of the Related Art

In electrically erasable programmable read-only memories (EEPROMs) or flash EEPROMs operated by a single power source, it is very important for the control of a cell threshold value after writing to select suitably an internally produced high programming voltage. Further, it is required that such a programming voltage is stable even under any circumstance, and it is desirable to be in dependency upon temperature variations and power source voltage variations. Simultaneously, this programming voltage has to have a high current supply capability so that it does not cause a voltage drop due to a programming current or an increasing parasitic leak current under high temperature conditions.

If there is a large dispersion among devices in several conditions upon manufacture, for example, in tunneling oxide film thickness or in tunneling area when a tunnel current running through an oxide film between a floating gate and a substrate is used for writing, the programming high voltage has to be adjusted respectively to a suitable value corresponding to the dispersion.

In order to satisfy the above-conditions, a powerful charge-pump circuit has been usually used as a voltage boosting circuit. In this system, a voltage measuring circuit determines whether the pumped-up voltage is at a suitable desired value or not, and if it exceeds the desired value, the pumping operation of the charge pump circuit is stopped.

Conventionally, for example, U.S. Pat. No. 4,952,821 discloses such a kind of the art. The arrangement disclosed in this publication will be explained with reference to the drawings.

FIG. 2 is a circuit diagram illustrating an example of conventional voltage measuring circuits.

This voltage measuring circuit has an input terminal 1a at which a voltage Vg to be measured is internally pumped up. The capacitors 1, 2 are connected in series through a floating node N1 to divide the voltage Vg to be measured. Further, an N-MOS 3 for a reset operation is connected to the node N1 and to one end of capacitors 4 to 6 forming a predetermined capacitance ratio. Further, the other ends of the capacitors 4 to 6 are connected to a desired value setting section 10.

The desired value setting section 10 is a circuit for setting a desired value of the voltage Vg to be measured in accordance with three bit data D1, D2, D3 stored in an internal memory element. The section 10 is composed of N-MOS transistors 11 to 16 as switching elements, and inverters 17 to 19. Further, the node N2 connected to the N-MOS 11 to 13 is connected to the output of a constant voltage circuit 20 for generating a reference voltage and to a differential amplifier 30.

The differential amplifier 30 has its input terminals connected to the node N1 and to the node N2, and is a circuit for amplifying a voltage difference between the nodes N1, N2, and for delivering an output signal OUT as a digital value from its output terminal 30a.

Further, the input terminal 1a is connected to a charge pump circuit (not shown) for generating the voltage Vg to be measured, and which has a function of controlling the pumping operation (or voltage boost-up operation) in response to an output signal OUT.

Explanation will be made of operation.

The input voltage Vg to be measured is divided into a voltage ratio between the capacitors 1, 2, to generate a voltage value near to the reference voltage from the constant voltage circuit 20. Meanwhile, a ground level given by data D1, D2, D3 having level "H", or a reference voltage level by data D1, D2, D3 having level "L" is fed to the node N2, selectively Further, when the voltage level of the node N1 exceeds that of the node N2, the differential amplifier 30 delivers the output signal OUT in "L" level from its output terminal 30a.

For example, when the voltage Vg to be measured increases up to a desired voltage, the voltage level of the node N1 exceeds that of the node N2. As a result, the output signal OUT in level "L" is delivered from the output terminal 30a. Accordingly, the pumping operation of the charge pump circuit is stopped. When the level of the voltage Vg to be measured lowers, the voltage level of the node N1 is below the voltage of the node N2. As a result, the output signal OUT is turned into level "H" so as to reinitiate the pumping operation. After such an operation is repeated, the voltage Vg to be measured is stabilized around the desired value.

With the use of the above-mentioned circuit, the detection level of the voltage Vg to be measured is less of dependency upon temperature and power source voltage. Since a completely linear relationship is maintained with respect to the reference voltage, whereby it is possible to obtain a stable operation.

However, the above-mentioned voltage measurement circuit has offered the following problems:

During the operation, in such a case that the node N1 is in a floating condition, if the insulation around the conductor of the node N1 is insufficient, a charge leaks from the node N1, so that the voltage Vg to be measured is shifted from a desired value. In particular, since the flash type EEPROM erases all data therein, the erasing time is longer than that of the EEPROM, and the floating condition is sustained longer correspondingly. Accordingly, the possibility of leakage of charge from the node N1 increases. Further, when the data is erased at a high temperature, the possibility of leakage of charge increases.

BRIEF SUMMARY OF THE INVENTION

The present invention is made to overcome the above-mentioned problems. Accordingly, one object of the present invention is to provide a voltage measuring circuit which can maintain the voltage to be measured to a desired value.

According to the present invention, a voltage measuring circuit comprises: a current converting transistor for converting a voltage to be measured into a first current, the current converting transistor having an input side electrode for receiving the first current; a constant voltage supplying means for supplying a predetermined voltage at least to the input side electrode; a voltage/current converting circuit for converting a current difference between the first current and a reference current into a voltage in cooperation with the constant voltage supplying means, and a reference current generating circuit for generating the reference current in accordance with a predetermined data.

In the above-mentioned voltage measurement circuit, the constant voltage applying means may be composed of: a first transistor with a predetermined impedance connected in series to the input side electrode of the current converting transistor, an energized condition of the first transistor being controlled by a constant voltage; and a second transistor having an impedance equal to that of the first impedance, its energized condition of the second transistor being controlled by the above-mentioned constant voltage; and further, the reference current generating means may be composed of: a switching transistor connected to the second transistor and to be turned on and off in accordance with the data; and a current source connected to the switching transistor in series.

With the voltage measuring circuit having the above-mentioned arrangement according to the present invention, the current converting transistor converts a voltage to be measured into a first current while the constant voltage supplying means supplies a predetermined voltage to the input side electrode of the current converting transistor, thereby restraining the dependency upon power source voltage and temperature to a desired voltage value to be measured. Further, the current/voltage converting means converts a current difference between the first current and a reference current into a voltage in cooperation with the constant voltage supplying means. The reference current generating circuit generates the reference voltage in accordance with a predetermined data for setting the desired voltage value to be measured.

Accordingly, the above-mentioned problems can be solved.

Further scope of applicability of the present invention will become apparent from the detailed description and specific examples, while preferred embodiments of the invention indicated hereinbelow are given by way of illustration only, since various changes and modification within the spirit and scope of the invention will become apparent to those skilled in the art from this detailed description.

BRIEF DESCRIPTION OF THE DRAWINGS

These and other features and advantages of the invention may be more completely understood from the following detailed description of the preferred embodiments of the invention with reference to the accompanying drawings in which.

DETAILED DESCRIPTION OF THE PREFERRED EMBODIMENTS

Figure 1:
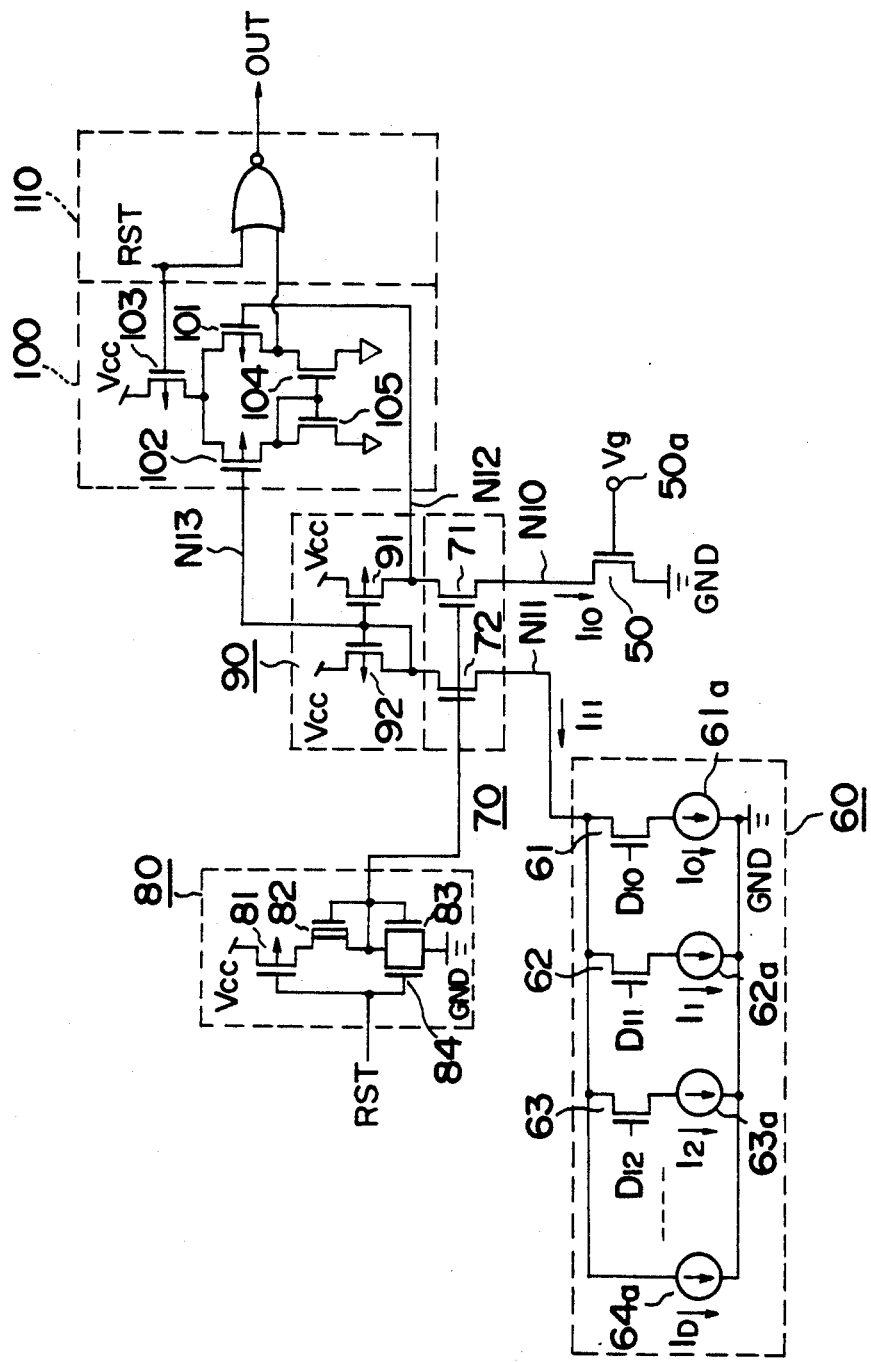
FIG. 1 is a circuit diagram illustrating an arrangement of a voltage measuring circuit in an embodiment of the present invention.
Figure 2:
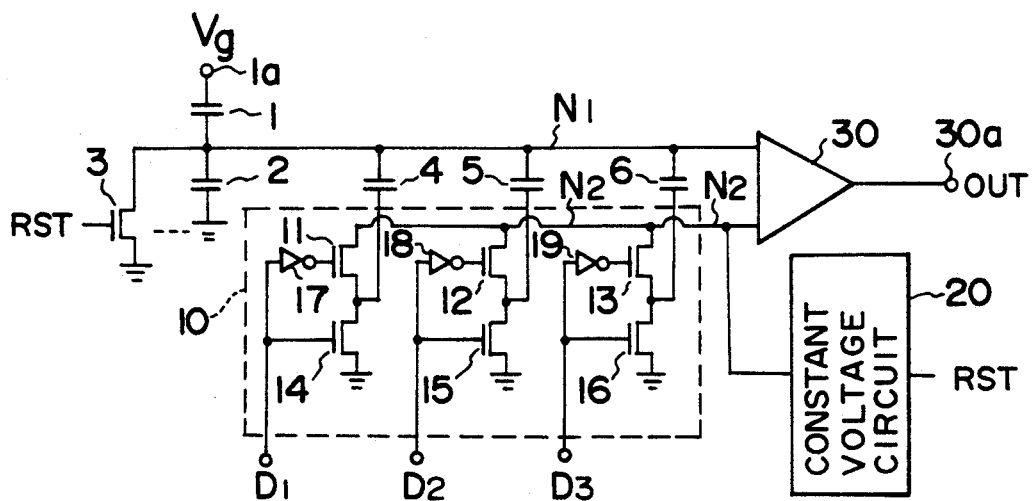
FIG. 2 is a block diagram illustrating an arrangement of a conventional voltage measuring circuit.

FIG. 1 is a circuit diagram showing an arrangement of a voltage measuring circuit in an embodiment of the present invention. An N-MOS transistor 50 is a current converting transistor for converting a voltage Vg to be measured into a current $I_{10}$. The N-MOS transistor 50 has its gate connected to an input terminal 50a for receiving the voltage Vg to be measured, its source connected to a ground GND, and its drain connected to a constant voltage transmitting circuit 70 through a node N10.

A reference current generating circuit 60, has N-MOS transistors 61, 62, 63 ... as switching transistors and current sources 61a to 63a composed of N-MOSs or the like are connected respectively in series between the node N11 and the ground GND. Further, a current source 64a is connected therebetween. In this arrangement, the N-MOS transistors 61, 62, 63 . . . have a switching function in accordance with n bit data D10, D11, D12 ... from a non-volatile memory (not shown). With this switching function, the reference current generating circuit 60 is constituted as a circuit for generating a reference current $I_{11}$.

The voltage transmitting 70 is composed of an N-MOS transistor 71 which is a first transistor having its source connected to the node N10, and an N-MOS transistor 72 acting as a second transistor having its source connected to the node N11. These N-MOS transistors 71, 72 have the same impedance, having their gates connected thereto with a constant voltage source 80.

The constant voltage source 80 is composed of a p-channel MOS transistor 81 and N-MOS transistors 82 to 84. A reset signal RST are fed to the gates of the P-MOS transistor 81 and the N-MOS transistor 84.

It is noted that the N-MOS transistors 71, 72 amplify a voltage difference between the voltage of the node N10 and the voltage of the node N11. The N-MOS transistor 71 applies a predetermined voltage to the node N11. Further, the drains of the N-MOS transistors 71, 72 are connected to a current/voltage converting section 90.

The current/voltage converting means 90 is a circuit for converting a current difference between the first current $I_{10}$ and the second current $I_{11}$ in cooperation with the voltage transmitting circuit 70, and is composed of a P-MOS transistor 91 having its drain and source connected respectively to a constant voltage Vcc and the drain of the N-MOS transistor 71 in the constant voltage application means 70, and a P-MOS transistor 92 having its drain and source connected respectively to the constant voltage Vcc and the drain of the N-MOS 72 in the constant voltage supplying means 70. Further, the gates of the P-MOS transistors 91, 92 are connected commonly to the drain of the P-MOS transistor 92 so as to constitute a current mirror circuit. Further, the drain of the P-MOS transistor 91 and the gates of the P-MOS transistors 91, 92 are connected to a differential amplifying circuit 100 through the nodes N12, N13.

The differential voltage amplifying circuit 100 is a circuit for amplifying a voltage difference between the voltage V12 of the node N12 and the voltage V13 of the node N13 and for delivering the amplified value in the form of a digital value, and is composed of P-MOS transistors 101, 102, 103 and N-MOS transistors 104, 105. Further, the output of the differential voltage amplifying circuit 100 is connected to the reset means 110 composed of an NOR gate which receives the reset signal RST and an output signal from the differential amplifying circuit 100 to deliver an output signal OUT.

Further, the input terminal 50a is connected to a charge pump circuit (not shown) for generating the voltage Vg to be measured. The charge pump circuit is controlled in accordance with the output signal OUT.

Explanation will be made hereinbelow of the operation of the voltage measuring circuit as stated above.

Figure 3:
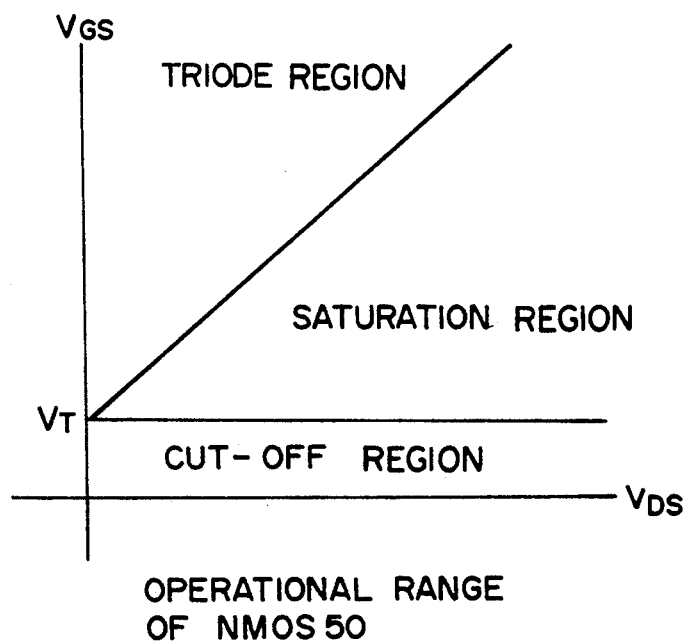
FIG. 3 is a view illustrating an operational range of an N-MOS transistor 50.

When the voltage Vg is applied to the input terminal 50a, the voltage V10 ($=V_c-V_T$; $V_T$ is a threshold value of the N-MOS 71) of the node N10 becomes about 1 V which is constant, so that constant voltage Vc of about 2 V is applied to the gate of the N-MOS transistor 71 from the constant voltage source 80. Since the voltage Vg to be measured is higher than the power source voltage Vcc, $(V_g-V_T)$ is always greater than the voltage V10 of the node N10. Accordingly, the N-MOS transistor 50 is operated in a triode range (refer to FIG. 3) in which a current between its source and drain is in proportion to its gate voltage $-V_T$. That is, when the voltage V10 of the node N10 is constant, $(V_g-V_T)$ is in proportion to the first current $I_{10}$. Thus, the voltage V9 to be measured is converted into the first current $I_{10}$.

Meanwhile, in the reference current circuit 60, the N-MOS transistors 61, 62, 63 ... are turned on and off in accordance with n bit data D10, D11, D12 ... Accordingly, the reference current $I_{11}$ becomes the sum of the current sources which are selected by the N-MOSs 61, 62, 63 ..., and the reference current $I_{11}$ is given by the following formula:

$$I_{11}=I_D+A_0I_0+A_1I_1+A_2I_2+\ldots \quad (1)$$

where $A_1, A_2, A_3 \ldots$ are variables each giving "1" when while the data have level "L".

Figure 5:
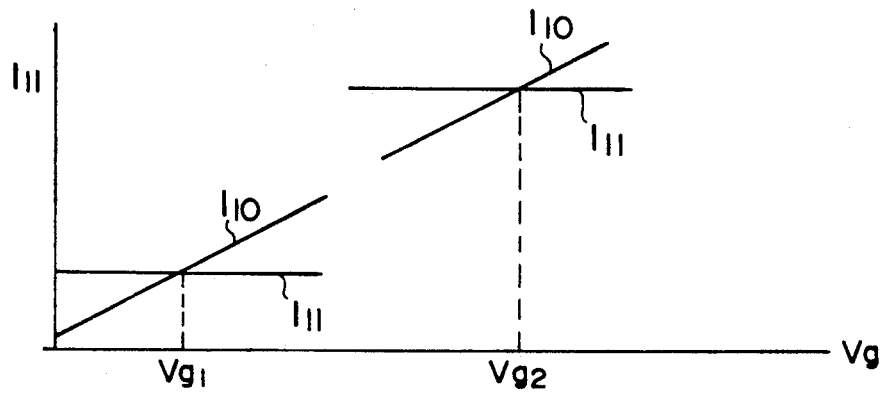
FIG. 5 is a view showing the relationship between a first current and a reference voltage.

FIG. 5 shows the relationship between the first current $I_{10}$ and the reference current $I_{11}$. When the Vg to be measured is set to Vg1 and Vg2, respectively, the first current $I_{10}$ does not depend upon the value of the reference current $I_{11}$, but is substantially proportional to the voltage Vg to be measured.

Figure 4A:
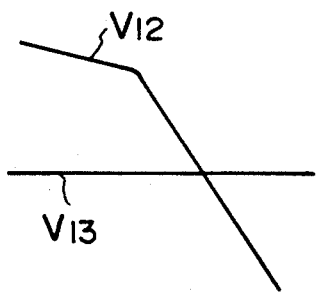
FIGS. 4(a) and 4(b) are views showing voltages of nodes during operation.
Figure 4B:
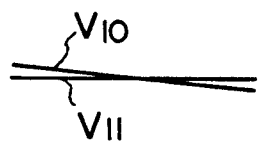

The current difference between the reference current $I_{11}$ and the first current $I_{10}$ is converted into a voltage by the voltage transmitting circuit 70 and the current/voltage converting means 90, and is delivered as voltages V12 and V13 through the nodes N12, N13, respectively. These voltages V12, V13 are amplified by the voltage transmitting circuit 70 up to values which are about 20 times as high as the voltage V10 of the node N10 and the voltage V11 of the node N11, respectively, as shown in FIGS. 4(a), 4(b). Thereafter, when the voltages V12, V13 are applied to the N-MOS transistors 101, 102 in the differential amplifying circuit 100, respectively, the difference between the voltages V12 and V13 is amplified and is then delivered in the form of a digital value. This digital value is delivered as the signal output OUT by way of the reset means 110. For example, when the voltage Vg increases up to a desired detection voltage, the output signal OUT having level "L" is delivered so as to stop the pumping operation of the charge pump circuit. When the level of the voltage Vg to be measured is decreased due to a programming current or the like, the output signal OUT is turned into level "H" so as to reinitiate the pumping operation.

Such an operation is repeated, to stabilize the voltage to be measured around a desired voltage.

If $I_{10}=I_{11}$, the constant voltage supplying means 70 and the current/voltage converting means 90 equal the voltages V12, V13 to each other. Accordingly, when if $I_{10}>I_{11}$ the output signal OUT, a differential output of the voltages V12, V13, has level "L", but has level "H" if $I_{10}<I_{11}$. That is, by controlling the reference current $I_{11}$, the voltage Vg to be measured can be optionally changed when the output signal OUT is inverted by controlling the reference current $I_{11}$. Further, the relationship between the reference current $I_{11}$ and the voltage Vg to be measured is exhibited by the following first-order function:

$$V_g=\alpha I_{11}+\beta \ldots \quad (2)$$

From the above-mentioned formulas (1) and (2), the voltage Vg to be measured is obtained from the following formula:

$$V_g=A_0\alpha I_0+A_1\alpha I_1+A_2\alpha I_2+\ldots+\alpha I_D+\beta \quad (3)$$

By rewriting as $\alpha I_0=\alpha_0$, $\alpha I_1=\alpha_0$, $\alpha I_2=\alpha_2$, ... $\alpha I_D+\beta=B$, the voltage Vg to be measured can be given by the following formula:

$$V_g=A_0\alpha_0+A_1\alpha_1+A_2\alpha_2+\ldots+B \quad (4)$$

that is, the voltage Vg to be measured can be optionally changed with the use of the n bit data D10, D11, D12 . . . For example, with the use of three bit data D10, D11, D12 alone, when the ratio among currents $I_0, I_1, I_2$ of the current sources is set to 1:2:4, the voltage Vg to be measured is equally divided by 8 with equal intervals.

It is to be noted that the present invention should not be limited to the above-mentioned embodiment as shown in the drawings. For example, as a variant form of the present invention, the following arrangement can be exemplified:

(a) Although N-MOS transistors are used for the current converting transistor and the constant voltage supplying means 70 in the above-mentioned embodiment, P-MOS transistors and bipolar transistors, for example, can be used therefor.

Figure 6:
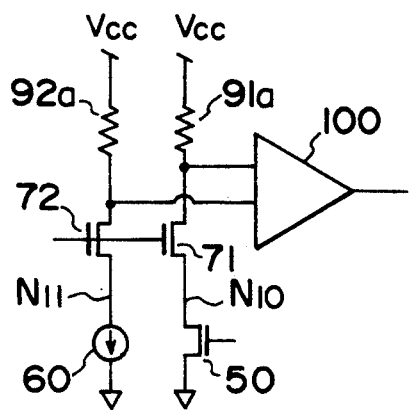
FIG. 6 is a view illustrating a variant form of the present invention.

(b) Although the current mirror circuit is used for the current/voltage converting means 90 in the above-mentioned embodiment, resistors 91a, 92a, for example, can be used as shown in FIG. 6.

(c) Although N-MOS transistors are used for current sources 61a to 63a in the above-mentioned embodiment, they are not limited to these, but they can be composed of resistors or depletion-type transistors.

As mentioned above, according to the present invention, a voltage to be measured is converted into a first current by a current converting transistor, and a current difference between the first current and a reference current is converted into a voltage which is then delivered. Accordingly, the voltage measuring circuit can be constituted without use of the floating node, whereby it is possible to prevent variations in a desired voltage value to be measured. Further, the dependency of the desired value of the voltage to be measured upon temperature, source voltage and the like can be substantially equal to those of the conventional one.

What we claim is:

1. A voltage measuring circuit comprising:

a current converter having an input terminal and a first current terminal for converting a voltage applied to the input terminal thereof into a current at the first current terminal thereof;

a reference current generating circuit having a second current terminal for generating a reference current on the second current terminal thereof;

a current/voltage converting circuit having first and second nodes and first and second output terminals, the current/voltage converting circuit converting currents at the first and second nodes thereof into voltages outputted at the first and second output terminals; and a voltage transmitting circuit having a first path electrically connected between the first node of said current/voltage converting circuit and the first current terminal, and a second path electrically connected between the second node of said current/voltage converting circuit and the second current terminal, the first path and the second path having the same impedance.

2. A voltage measuring circuit according to claim 1 wherein said current converter comprises a current converting transistor having a gate electrode connected to the input terminal thereof, a first electrode connected to the first current terminal and a second electrode connected to ground.

3. A voltage measuring circuit according to claim 1 wherein said reference current generating circuit comprises a constant current source connected between the second current terminal and ground.

4. A voltage measuring circuit according to claim 1 wherein said reference current generating circuit comprises a plurality of constant current sources connected in parallel between the second current terminal and ground.

5. A voltage measuring circuit according to claim 4 wherein said reference current generating circuit further comprises a plurality of transistors each of which is connected between the second current terminal and one of the constant current sources.

6. A voltage measuring circuit according to claim 1 wherein the first path of said voltage transmitting circuit comprises a first transmitting transistor having a first electrode connected to the first node, a second electrode connected to the first current terminal and a gate electrode, and the second path of said voltage transmitting circuit connected to the second node, a second electrode connected to the second current terminal and a gate electrode.

7. A voltage measuring circuit according to claim 6 wherein said voltage transmitting circuit comprises a constant voltage source circuit having an output terminal connected to the gate electrode of the first and second transmitting transistors.

8. A voltage measuring circuit according to claim 1 wherein said current/voltage converting circuit comprises a first current transistor having a first electrode connected to a power source, a second electrode connected to both the first node and the first output terminal of the current/voltage converting circuit and a gate electrode and a second current transistor having a first electrode connected to the power source, a second electrode connected to the second node and the second output terminal of the current/voltage converting circuit and a gate electrode connected to the second electrode of the second current transistor and to the gate electrode of the first current transistor.

9. A voltage measuring circuit according to claim 1 further comprising a differential amplifying circuit having a first input terminal connected to the first output terminal of said current/voltage converting circuit, a second input terminal connected to the second output terminal of said current/voltage converting circuit and an output terminal.

10. A voltage measuring circuit comprising:

a voltage-current converter having an input terminal and a first current terminal, the voltage-current converter generating a first current at the first current terminal, a current value of the first current being related to a voltage applied to the input terminal;

a reference current generating circuit having a second current terminal for generating a reference current at the second current terminal; and a current-voltage converter having a first node connected to the first current terminal, a second node connected to the second current terminal, a first output terminal and a second output terminal, the current-voltage converter outputting signals to the first and second output terminals thereof, the voltage values of the signals being relative to the currents at the first and second nodes, respectively.

11. A voltage measuring circuit according to claim 10 wherein said voltage-current converter comprises a current converting transistor having a gate electrode connected to the input terminal thereof, a first electrode connected to the first current terminal and a second electrode connected to ground.

12. A voltage measuring circuit according to claim 10 wherein said reference current generating circuit comprises a constant current source connected between the second current terminal and ground.

13. A voltage measuring circuit according to claim 10 wherein said current-voltage converter includes:

a current mirror circuit having a third node connected to the first output terminal of the voltage measuring circuit and a fourth node connected to the second output terminal of the voltage measuring circuit, and a voltage difference amplifier having a first input terminal connected to the first current terminal, a second input terminal connected to the second current terminal, a first output terminal connected to the third node and a second output terminal connected to the fourth node, said voltage difference amplifier amplifying the voltage difference between the voltages at the first and second input terminals thereof and outputting the amplified voltage difference at the first and second output terminals thereof.

14. A voltage measuring circuit according to claim 13 wherein the voltage difference amplifier comprises a first amplifying transistor having a first electrode connected to the third node, a second electrode connected to the first current terminal and a gate electrode, and the second path of said current transmitting circuit is composed of a second amplifying transistor having a first electrode connected to the fourth node, a second electrode connected to the second current terminal and a gate electrode.

15. A voltage measuring circuit according to claim 14 wherein the first and second amplifying transistors have the same impedance.

16. A voltage measuring circuit according to claim 13 wherein the voltage difference amplifier includes a constant voltage source circuit having an output terminal connected to the gate electrodes of the first and second amplifying transistors.

17. A voltage measuring circuit according to claim 16 wherein the constant voltage source circuit includes a reset terminal and outputs a switching signal in response to a reset signal applied to the reset terminal thereof and to turn off the first and second amplifying transistors.

18. A voltage measuring circuit according to claim 10 further comprising a differential amplifying circuit having a first input terminal connected to the first output terminal of said current-voltage converter, a second input terminal connected to the second output terminal of said current-voltage converter, and an output terminal.

19. A voltage measuring circuit according to claim 18 further comprising a reset circuit having a reset input terminal receiving a reset signal and a signal input terminal connected to the output terminal of the differential amplifying circuit.

* * * * *